(12) United States Patent
Lunsman et al.

(10) Patent No.: US 11,157,050 B1
(45) Date of Patent: Oct. 26, 2021

(54) COMPUTE NODE TRAY COOLING

(71) Applicant: HEWLETT PACKARD ENTERPRISE DEVELOPMENT LP, Houston, TX (US)

(72) Inventors: Harvey J. Lunsman, Chippewa Falls, WI (US); Ernesto Ferrer Medina, Aguadilla, PR (US); Tahir Cader, Liberty Lake, WA (US); Steven Dean, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/860,926

(22) Filed: Apr. 28, 2020

(51) Int. Cl.
  *G06F 1/20* (2006.01)
  *H05K 7/20* (2006.01)

(52) U.S. Cl.
  CPC .......... *G06F 1/20* (2013.01); *H05K 7/20254* (2013.01); *H05K 7/20272* (2013.01); *H05K 7/20409* (2013.01); *H05K 7/20509* (2013.01)

(58) Field of Classification Search
  CPC .......... H05K 7/20772; H05K 7/20781; H05K 7/20254; H05K 7/20272; H05K 7/20509; H05K 7/20409; G06F 1/20; G06F 2200/201
  See application file for complete search history.

(56) References Cited

U.S. PATENT DOCUMENTS

| | | | |
|---|---|---|---|
| 7,791,882 B2 | 9/2010 | Chu et al. | |
| 8,564,953 B2 | 10/2013 | Horiuchi et al. | |
| 9,445,529 B2 | 9/2016 | Chainer et al. | |
| 10,111,364 B2 | 10/2018 | Arvelo et al. | |
| 2003/0010477 A1* | 1/2003 | Khrustalev | F28D 15/0266 165/104.33 |
| 2007/0012423 A1 | 1/2007 | Kinoshita et al. | |

(Continued)

FOREIGN PATENT DOCUMENTS

CN 109814689 A 5/2019

OTHER PUBLICATIONS

Sparrow, E.M. et al., "The Design of Cold Plates for the Thermal Management of Electronic Equipment," Heat Transfer Engineering, Aug. 2006, vol. 27, No. 7, https://www.researchgate.net/publication/229028700_The_Design_of_Cold_Plates_for_the_Thermal_Management_of_Electronic_Equipment/link/53fc06b60cf22f21c2f3a182/download.

*Primary Examiner* — Adam B Dravininkas
(74) *Attorney, Agent, or Firm* — Hewlett Packard Enterprise Patent Department

(57) ABSTRACT

Example implementations relate to a method and system for cooling a compute node tray including a board, a plurality of first and second devices, a cooling assembly, and a support structure assembly. The cooling assembly includes a supply section, a return section, and an intermediate section coupled to the supply and return sections. The supply section includes a first conduit extending along a perimeter of the board and forming a thermal contact with the first devices. The intermediate section includes a plurality of cold plates and a plurality of second conduits forming the thermal contact with the second devices. The second conduits extends parallel to one another. The return section includes a third conduit extending parallel to a portion of the first conduit. The support structure encompasses the board and forms the thermal contact with a portion of the board, a plurality of third devices, and the cooling assembly.

20 Claims, 10 Drawing Sheets

(56) References Cited

U.S. PATENT DOCUMENTS

| | | | |
|---|---|---|---|
| 2008/0163631 A1* | 7/2008 | Campbell | H05K 7/20809 |
| | | | 62/175 |
| 2008/0310104 A1* | 12/2008 | Campbell | H05K 7/20772 |
| | | | 361/690 |
| 2009/0065178 A1 | 3/2009 | Kasezawa | |
| 2010/0252234 A1* | 10/2010 | Cambell | H05K 7/20781 |
| | | | 165/80.2 |
| 2011/0313576 A1* | 12/2011 | Nicewonger | F28D 15/00 |
| | | | 700/282 |
| 2012/0188719 A1* | 7/2012 | El-Essawy | G06F 1/18 |
| | | | 361/701 |
| 2012/0281358 A1* | 11/2012 | Chainer | H05K 7/20781 |
| | | | 361/700 |
| 2014/0124190 A1* | 5/2014 | Campbell | F28F 27/02 |
| | | | 165/296 |
| 2015/0090425 A1* | 4/2015 | Shelnutt | G06F 1/183 |
| | | | 165/56 |
| 2015/0131224 A1* | 5/2015 | Barina | G06F 1/20 |
| | | | 361/679.53 |
| 2016/0242318 A1* | 8/2016 | Krug, Jr. | H05K 7/20772 |
| 2019/0254199 A1* | 8/2019 | Lipp | H05K 7/1489 |
| 2020/0163257 A1* | 5/2020 | Franz | H05K 7/20836 |

* cited by examiner

COMPUTE NODE TRAY COOLING

BACKGROUND

A board (printed circuit board) included in a server tray or a compute node tray of a computing system, such as a liquid-cooled rack may generate a large amount of heat during operation. In particular, the heat may be emitted by a plurality of devices disposed on the board. The plurality of devices may include electronic devices electrically connected to printed circuits on the board and supported by the board. The plurality of devices may also include portions of the board, itself. A coolant distribution unit (CDU) is fluidically coupled to the liquid-cooled rack for circulating a coolant to the compute node tray for absorbing the heat from the plurality of devices, and thereby cool the compute node tray.

BRIEF DESCRIPTION OF THE DRAWINGS

Various examples will be described below with reference to the following figures.

DETAILED DESCRIPTION

Figure 1A:
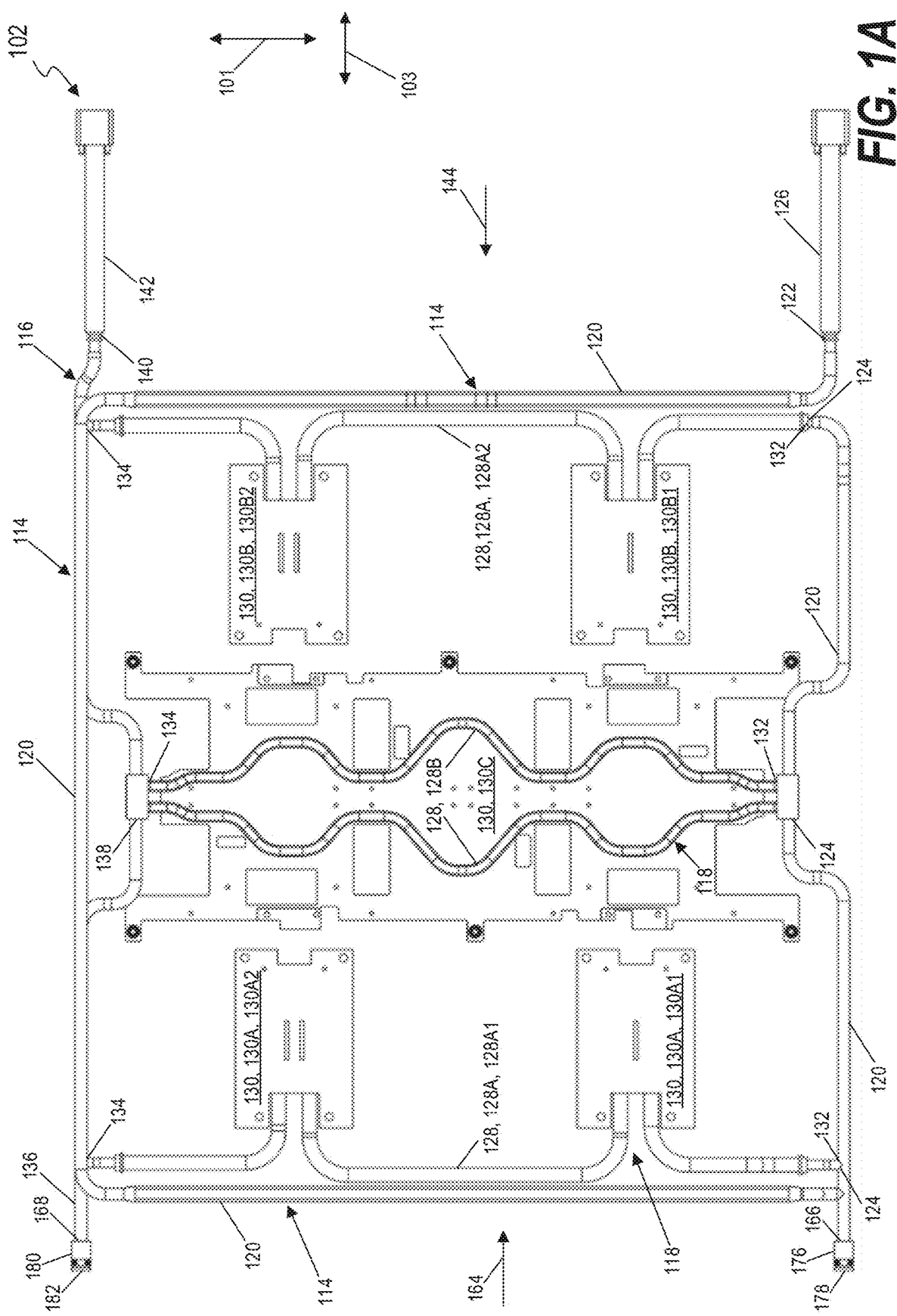
FIG. 1A illustrates a schematic diagram of a cooling assembly of a compute node tray.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on. The term "cold plate" refers to a hollow metal block having internal passages through which a coolant is forced, thereby absorbing heat transferred to the block by an electronic device to which it is mounted. The term "cold block" refers to a solid metal block absorbing the heat conducted to the block by the electronic device to which it is mounted. The term "upstream cold plate" or "upstream processing resource" refer to a component which is nearer to a flow of the coolant in a cooling assembly. Similarly, the term "downstream cold plate" or "downstream processing resource" refer to a component which is farther to the flow of the coolant in the cooling assembly.

The present disclosure describes example implementations of a method and a system for cooling a compute node tray installed in a liquid-cooled rack. In certain examples, the compute node tray is a twinned-compute node tray. In some examples, the compute node tray includes a cooling assembly and a support structure assembly that are collectively used for absorbing heat from a board and a plurality of devices disposed on the board, and thereby cool the compute node tray. In such examples, the cooling assembly may first direct a coolant in a serial flow path for absorbing heat from the board and a plurality of first devices disposed on the board of the compute node tray. The cooling assembly may later direct the coolant in a plurality of parallel flow paths for absorbing the heat from the board and a plurality of second devices disposed on the board. Further, the support structure assembly encompasses the board and forms a thermal contact with a portion of the board, a plurality of third devices, and the cooling assembly. The support structure provides support to the board and absorbs the heat from the portion of the board, the plurality of third devices and transfers the absorbed heat to the cooling assembly. Additionally, the cooling assembly may direct the coolant into an extension space of the compute node tray for cooling a plurality of fourth devices disposed in the compute node tray.

For purposes of explanation, certain examples are described with reference to the components illustrated in FIGS. 1-7. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIG. 7 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

Typically, a rack may include a plurality of compute node trays, where each compute node tray may have a board (i.e., a printed circuit board) and a plurality of devices (i.e., electronic components) disposed on the board. During operation, the plurality of devices may generate a large amount of heat, which is accompanied by the heat emitted by portions of the board, itself. Therefore, the rack may additionally include a cooling system for absorbing the heat from the board and the plurality of devices, and thereby cool the compute node tray. One such cooling system, for example, an air cooling system may include one or more fans to circulate air across each compute node tray for absorbing the heat from the board and the plurality of devices. However, fans in the air cooling system may consume a lot of power, produce noise, and generate relatively hotter air (pre-heat) over a period of time. Further, due to pre-heat of the air by the first devices cooled on the board, subsequent devices will run hotter, such that the air cooling system cannot maintain the temperature across similar devices among the plurality of devices that are dispersed on the board of the compute node tray. Another such cooling system, for example, an immersion cooling system, which includes immersing the entire rack having the plurality of compute nodes, in a bath of a dielectric fluid for absorbing the heat from the plurality of devices. However, the dielectric fluid may have degradation issues over a period of time. Further, the compute node tray filled with the dielectric fluid may be difficult to service and expensive to maintain. Yet another such cooling system, for example, a liquid cooling system may include a fully parallelized flow to each of the plurality of devices of the compute node tray for absorbing the heat from each device. It may be noted herein that the term "fully parallelized flow" may refer to a separate conduit arrangement to supply coolant, for each electronic device of the board to absorb the heat from the respective electronic device. Such fully parallelized flow may substantially solve the problem of maintaining temperatures of similar devices of the plurality of devices, by providing the coolant having same inlet temperature to each of the plurality of devices. However, considering the characteristics of flow rate vs. temperature of the coolant, the fully parallelized flow design may require greater volume of the coolant to achieve the same thermal performance. Additionally, maintaining a flow balance of the coolant in the fully parallelized flow design, may be difficult. Therefore, the liquid cooling system having the fully parallelized flow design may require substantially higher flow rate to circulate the coolant within the liquid cooling system, require more fluid volume in each cold plate of the liquid cooling system, and is more expensive to manufacture and maintain.

A technical solution to the aforementioned problems may include a compute node tray having a liquid cooling assembly and a support structure assembly that may collectively absorb heat from a board and a plurality of devices, and thereby cool the compute node tray. In some examples, the cooling assembly includes a supply section, a return section, and an intermediate section coupled to the supply and return sections. The supply section includes a first conduit extending along a perimeter of a board and forming a thermal contact with a plurality of first devices of the board. Further, the intermediate section includes a plurality of cold plates and a plurality of second conduits forming the thermal contact with a plurality of second devices of the board. The plurality of second conduits extends parallel to one another. Similarly, the return section includes a third conduit extending parallel to a portion of the first conduit. In such examples, the cooling assembly is designed to first circulate a coolant in a serial flow path for absorbing heat from the plurality of first devices and later circulate the coolant in parallel flow paths for absorbing the heat from the plurality of second devices. It may be noted herein that each of the plurality of first devices is a low-power device, where the power consumption by the low-power device may be less than 12 W. In some examples, a plurality of low-power devices may include one or more of a plurality of dual in-line memory modules (DIMMs) or a plurality of voltage regulators. Similarly, each of the plurality of second devices is a high-power device, where the power consumption by the high-power device may be greater than 12 W. In some examples, a plurality of high-power devices may include one or more of a plurality of processing resources or a plurality of fabric mezzanine cards. Since, the coolant flowing in the serial path is used to first cool the plurality of low-power devices (i.e., without using coolant pre-heated by absorbing heat first from the high-power devices), the cooling assembly is able to maintain the temperature of all the low-power devices within a certain range from each other. Further, after the serial path cooling, since the coolant flowing in the parallel flow paths are used to cool the plurality of high-power devices, the cooling assembly is able to maintain the temperature of all the high-power devices within a certain range from each other. Thus, the cooling assembly having the combination of the serial and parallel flow paths design, may relatively decrease the required coolant flow rate in comparison with the required coolant flow rate in the fully parallelized flow design, for cooling the compute node tray. Further, since the cooling assembly design is able to relatively decrease the required coolant flow rate, a cooling distribution unit (CDU) that is used for supplying the coolant to the cooling assembly may be used for cooling a greater number of liquid-cooled racks. In other words, the cooling assembly having the serial and parallel cooling as discussed hereinabove may enable a lower flow rate to have a higher CDU to rack ratio, thus saving cost and decreasing power utilization efficiency (PUE, which is a measure of data center energy efficiency), and also relatively reducing pressure drop in comparison with the liquid cooling system that is designed based on the fully parallelized flow paths.

Further, the support structure assembly used to encompass the board may provide support to the board, and additionally form a thermal conduction path with a portion of the board, a plurality of third devices, and the cooling assembly for absorbing the heat from the portion of the board and the plurality of third devices and transfer the absorbed heat to the cooling assembly. Thus, the support structure assembly may effectively cool the board's hotspots and devices that are not cooled by the cooling assembly, without any other dedicated cooling solutions.

Figure 1C:
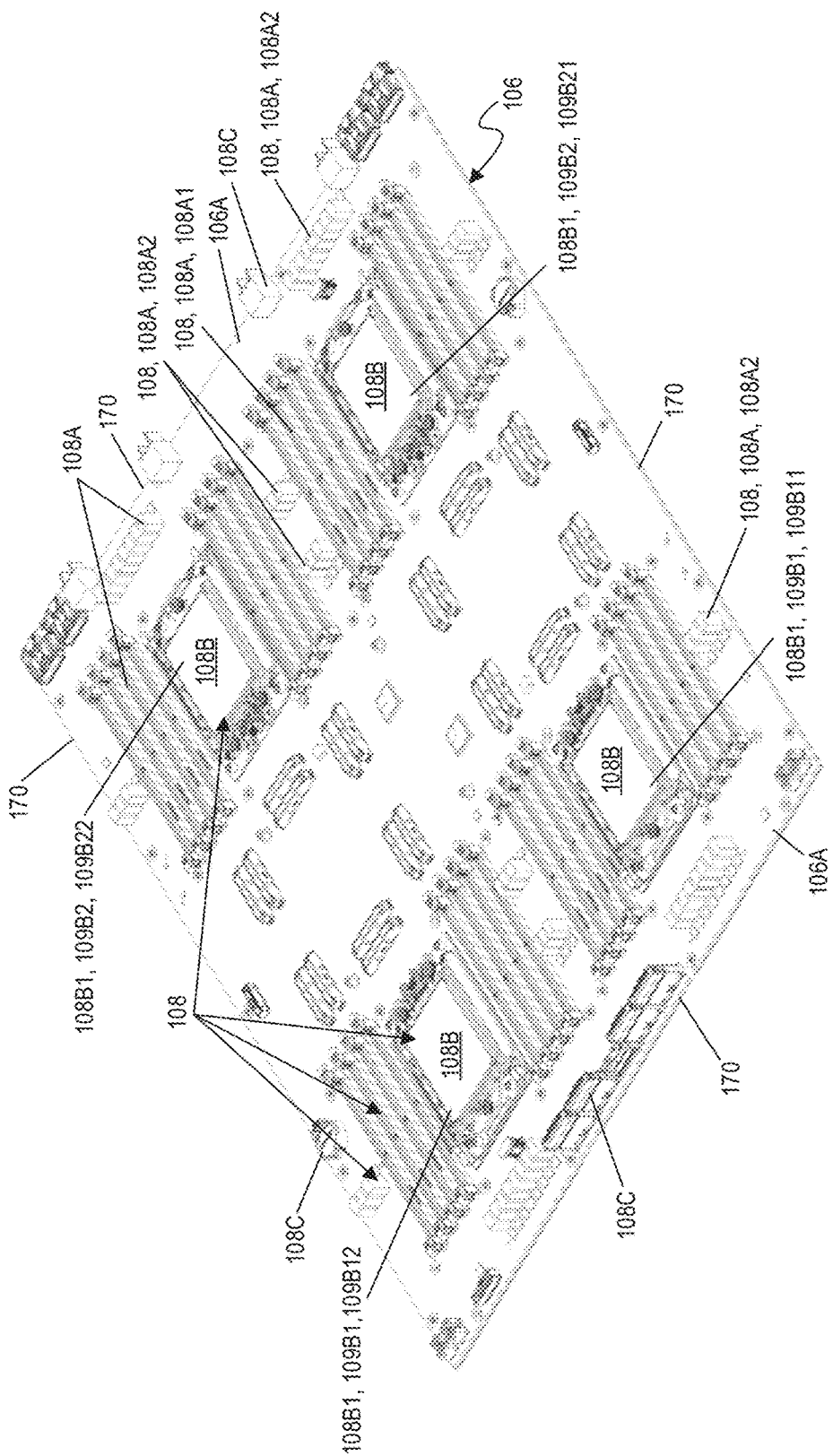
FIG. 1C illustrates a schematic diagram of a board and a plurality of devices of a compute node tray.
Figure 2A:
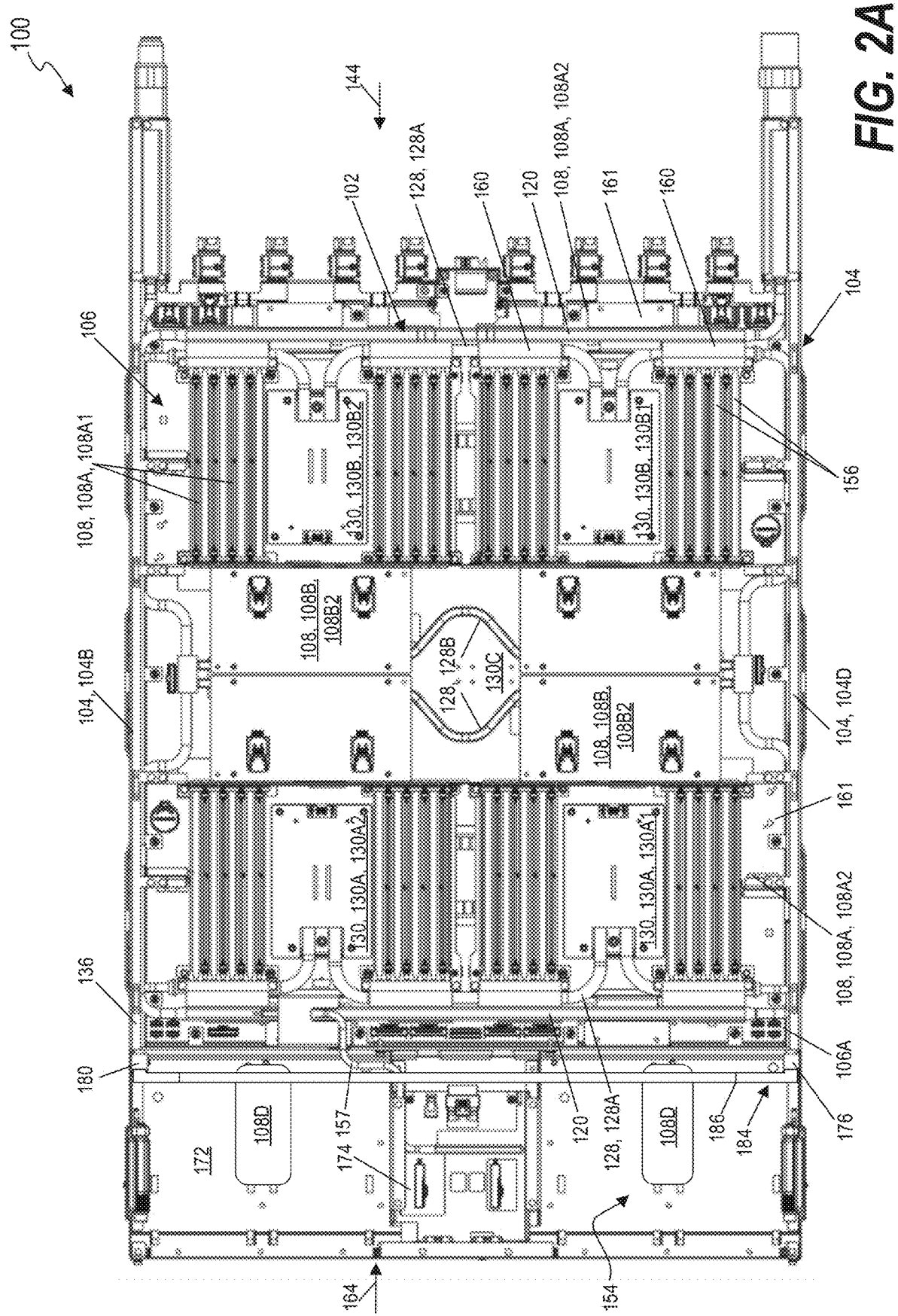
FIG. 2A illustrates a schematic diagram of a first compute node tray including the board, the plurality of devices, the cooling assembly, and the support structure assembly of FIGS. 1A, 1B, and 1C.

FIG. 1A is a schematic diagram of a cooling assembly 102 of a compute node tray 100 (as shown in FIG. 2A), in accordance to some examples of the present disclosure. It may be noted herein that the term "cooling assembly" may also be referred to herein as a "first cooling assembly". In some examples, the cooling assembly 102 may absorb heat from a board 106 (as shown in FIG. 1C) and a plurality of devices 108 (as shown in FIG. 1C) disposed on the board 106 for cooling the compute node tray 100. In some examples, the cooling assembly 102 includes a supply section 114, a return section 116, and an intermediate section 118 coupled to the supply and return sections 114, 116 respectively.

Figure 4:
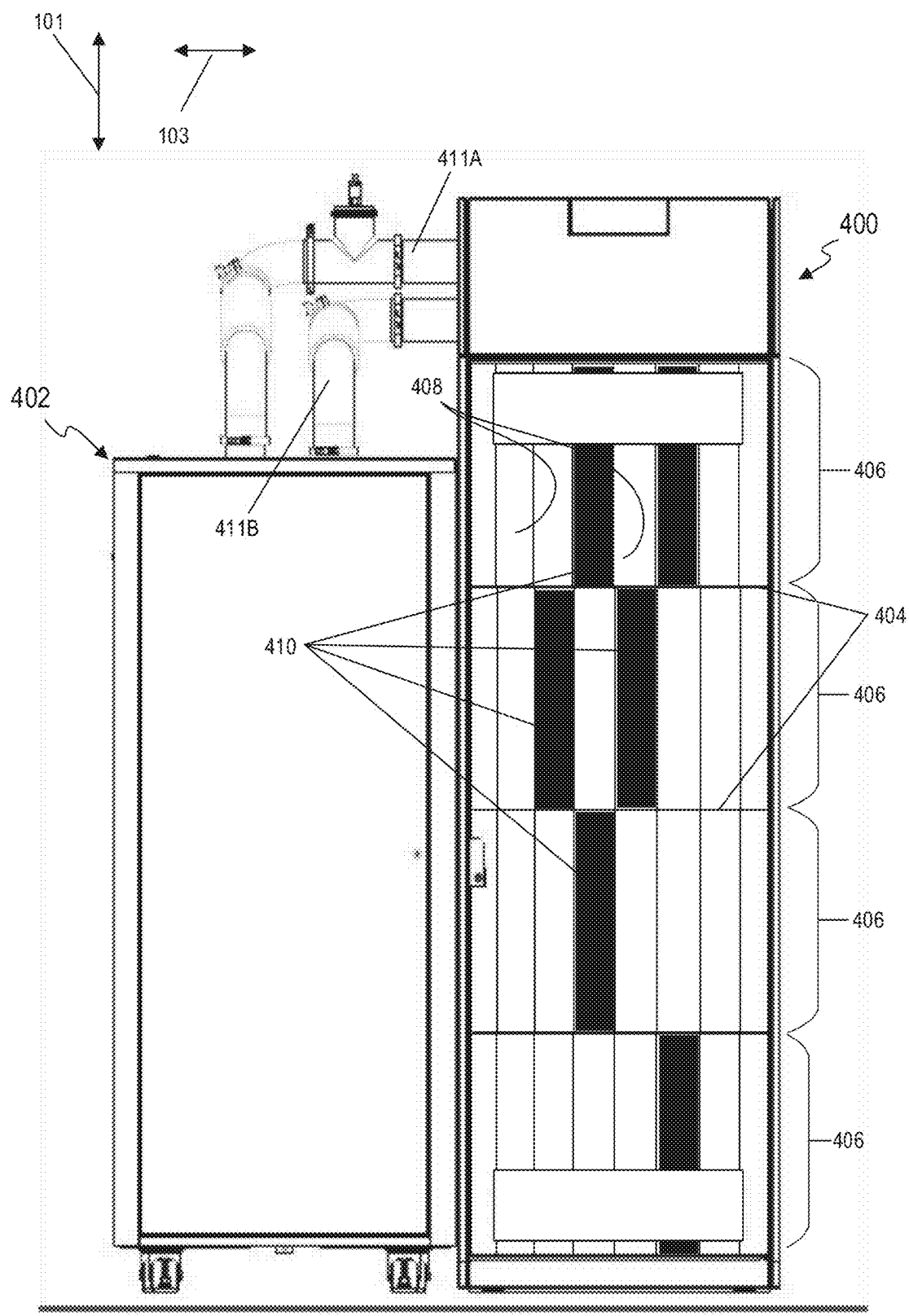
FIG. 4 illustrates a perspective view of a portion a coolant distribution unit and a liquid-cooled rack including a plurality of compute node trays.

The supply section 114 includes a first conduit 120 having an inlet port 122 and a plurality of outlet ports 124. In some examples, the first conduit 120 extends along radial and axial directions 101, 103 respectively to form a squared or a rectangular loop-like structure. Further, the inlet port 122 is located at a bottom portion of the cooling assembly 102 and coupled to a coolant inlet port 126 of a coolant distribution unit (CDU) 402 (as shown in FIG. 4).

The intermediate section 118 includes a plurality of second conduits 128 and a plurality of cold plates 130. The plurality of second conduits 128 is spaced apart from each other and extends parallel to one another. In some examples, each tube of the plurality of second conduits 128 extends along the radial direction 101, and has an inlet port 132 and an outlet port 134. The inlet port 132 is coupled to a respective outlet port 124 of the first conduit 120. In some examples, the plurality of second conduits 128 may be categorized as a first set of tubes 128A and a second set of tubes 128B. In such examples, the second set of tubes 128B is disposed between the first set of tubes 128A. In one example, each tube of the first set of tubes 128A is a flexible tube. It may be noted herein that the flexible tube may enable easy servicing of individual processing resources 108B1 (as shown in FIG. 1C) without disturbing any other aspect of the plurality of cold plates 130.

Similarly, the plurality of cold plates 130 may be categorized as a first set of cold plates 130A and a second set of cold plates 1306. In such examples, the first set of cold plates 130A has an upstream cold plate 130A1 and a downstream cold plate 130A2. Similarly, the second set of cold plates 130B has an upstream cold plate 130B1 and a downstream cold plate 130E32. The upstream and downstream cold plates 130A1, 130A2 of the first set of cold plates 130A are arranged in a serial flow configuration. Similarly, the upstream and downstream cold plates 130B1, 130E32 of the second set of cold plates 1306 are arranged in the serial flow configuration.

The first set of tubes 128A includes a first tube 128A1 that connects the upstream and downstream cold plates 130A1, 130A2 of the first set of cold plates 130A. Similarly, the first set of tubes 128A includes a second tube 128A2 that connects the upstream and downstream cold plates 130B1, 130B2 of the second set of cold plates 130B. In the illustrated example, both tubes 128A1, 128A2 of the first set of tubes 128A are segregated to have three segments (not labeled). For example, a first segment of the first tube 128A1 is connected to the first conduit 120 and the upstream cold plate 130A1, a second segment of the first tube 128A1 is connected to the upstream and downstream cold plates 130A1, 130A2, and a third segment of the first tube 128A1 is connected to the downstream cold plate 130A2 and a third conduit 136 of the return section 116. Similarly, a first segment of the second tube 128A2 is connected to the first conduit 120 and the upstream cold plate 130B1, a second segment of the second tube 128A2 is connected to the upstream and downstream cold plates 130B1, 130B2, and a third segment of the second tube 128A2 is connected to the downstream cold plate 130E32 and the third conduit 136. In some examples, the upstream cold plates 130A1, 130B1 have a first thermal resistance and the downstream cold plates 130A2, 130E32 have a second thermal resistance. In some examples, the first thermal resistance is greater than the second thermal resistance. The thermal resistance of the upstream cold plates 130A1, 130B1 and the downstream cold plates 130A2, 130E32 are discussed in greater details below with reference to FIG. 6. Further, each tube of the second set of tubes 128B is disposed on a mid-board cold block 130C and has a serpentine flow path. The second set of tubes 1286 having the serpentine flow path may increase the thermal contact surface area with the mid-board cold block 130C, thereby increasing the absorption of heat from the plurality of second devices 108B. In the illustrated example, the cooling assembly 102 has four numbers of second conduits 128 and five numbers of cold plates 130.

As discussed hereinabove, the return section 116 includes the third conduit 136 having a plurality of inlet ports 138 and an outlet port 140. In some examples, the third conduit 136 extends along the axial direction 103. Each of the plurality of inlet ports 138 is coupled to a respective outlet port 134 of the plurality second conduits 128. Further, the outlet port 140 is located at a top portion of the cooling assembly 102 and is coupled to a coolant outlet 142 of the CDU 402. It may be noted herein that the inlet and outlet ports 122, 140 respectively, are positioned along a first peripheral side 144 of the cooling assembly 102. The first conduit 120 and the third conduit 136 further includes intermediate end portions 166, 168 respectively positioned along a second peripheral side 164 of the cooling assembly 102. In some examples, the intermediate end portion 166 includes a first o-ring port 176 and a first valve 178 detachably coupled to the first o-ring port 176. Similarly, the intermediate end portion 168 includes a second o-ring port 180 and a second valve 182 detachably coupled to the second o-ring 180.

In some examples, the first conduit 120 has a shortest supply path to the first tube 128A1 of the first set of tubes 128A, and the third conduit 136 has a longest return path from the first tube 128A1. Similarly, the first conduit 120 has a longest supply path to the second tube 128A2 of the first set of tubes 128A, and the third conduit 136 has a shortest return path from the second tube 128A2.

Figure 1B:
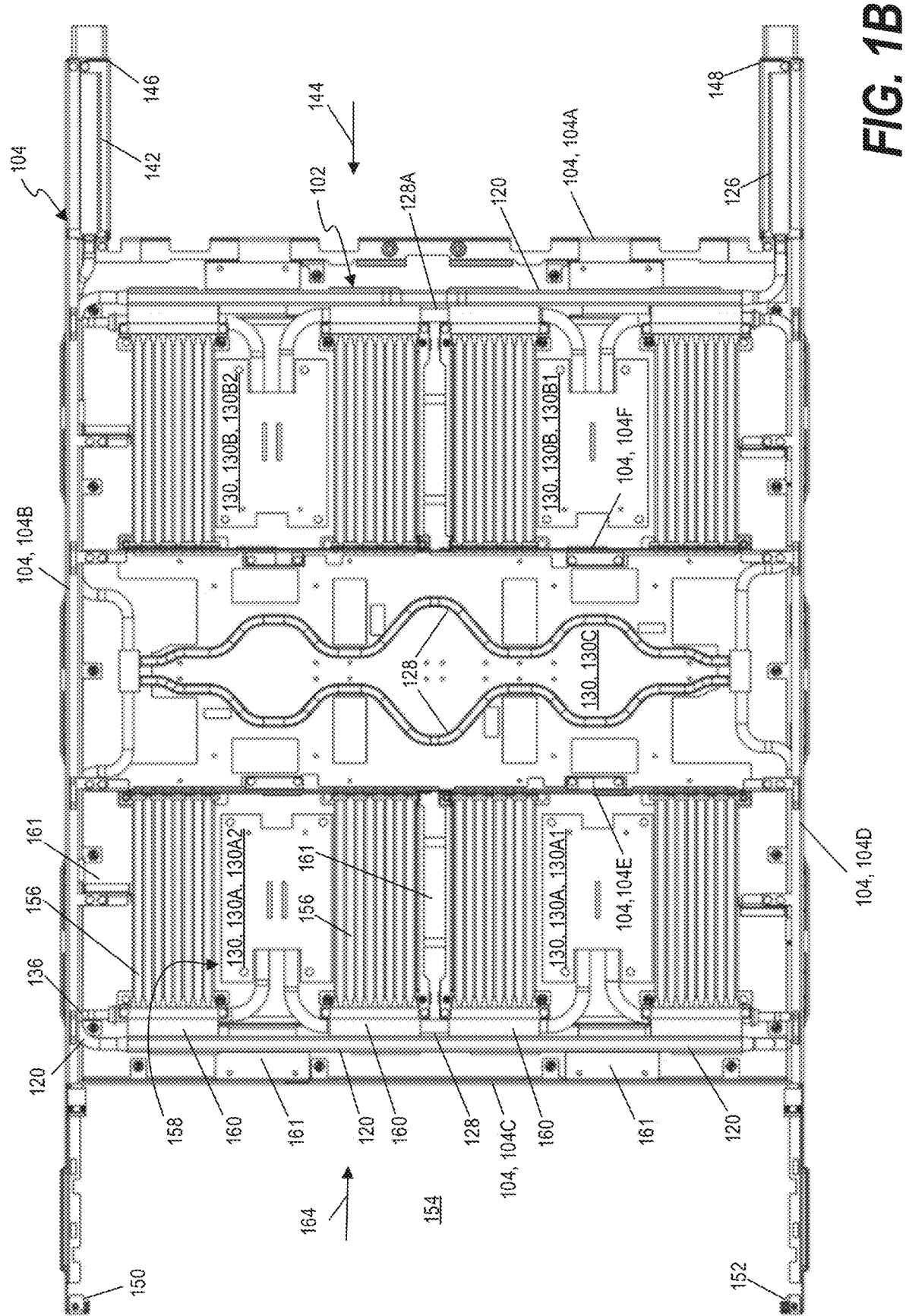
FIG. 1B illustrates a schematic diagram of a support structure encompassing the cooling assembly of FIG. 1A.

FIG. 1B is a schematic diagram of a support structure assembly 104 encompassing the cooling assembly 102 of the compute node tray 100 (as shown in FIG. 2A), in accordance to some examples of the present disclosure. It may be noted herein that the term "support structure assembly" may also be referred to herein as a "first sub-structure assembly".

In some examples, the support structure assembly 104 includes a plurality of frames 104A, 104B, 104C, 104D, each made of a sheet metal component, for example. In such examples, the frames 104A, 104C are spaced apart from each other and disposed parallel to one another. Similarly, the frames 104B, 104D are spaced apart from each other and disposed parallel to one another. The frames 104A, 104B, 104C, 104D are coupled to one another in the sequential order so as to form a square or a rectangular shaped structure. For example, the frame 104A is coupled to portions of the frames 104B, 104D, which are substantially inside from a respective first end 146, 148 of the frames 104B, 104D such that the frames 104B, 104D extends to support the coolant outlet port 142 and the coolant inlet port 126 of the CDU 402. Similarly, the frame 104C is coupled to portions of the frames 104B, 104D, which are substantially inside from a respective second end 150, 152 of the frames 104B, 104D so as to define an extension space 154 there between the portions of the frames 104B 104D. In other words, the extension space 154 is defined at the second peripheral side 164 of the cooling assembly 102. Further, the frames 104A, 104B, 104C, 104D are disposed in thermal contact with the first conduit 120 and the third conduit 136 so as to form a thermal conduction path with the cooling assembly 102. Further, the frames 104A, 104B, 104C 104D also form a thermal conduction path with the board 106.

The support structure assembly 104 may additionally include an intermediate support structure assembly 104E, 104F, each made of a sheet metal component, for example. In such examples, the frames 104E, 104F are spaced apart from each other and disposed parallel to one another. The frames 104E, 104F are coupled to frames 104B, 104D respectively. Further, the frames 104E, 104F are disposed along a length of the mid-board cold block 130C forming a thermal contact with the mid-board cold block 130C.

In the illustrated example of FIG. 1B, the cooling assembly 102 may additionally include a plurality of thermal transfer plates 156, for example, a plurality of heat pipes and a plurality of dual in-line memory module (DIMM) cold blocks 160 coupled to the first conduit 120. In such examples, the plurality of thermal transfer plates 156 is arranged in open spaces 158 that are located adjacent to each of the first and second set of cold plates 130A, 130B. Further, the plurality of thermal transfer plates 156 may form a thermal contact with a portion of the first conduit 120 via a respective DIMM cold block of the plurality of DIMM cold blocks 160.

The cooling assembly 102 may further include a plurality of voltage regulator (VR) cold blocks 161 coupled to the first conduit 120 so as to form a thermal contact with the first conduit 120. In some embodiments, the plurality of VR cold blocks 161 may include one or more of the VR cold blocks 161 for a plurality of DIMMs 108A1 (as shown in FIG. 1C) or a plurality of processing resources 108B1 (as shown in FIG. 1C).

FIG. 1C is a schematic diagram of a board (printed circuit board) 106 and a plurality of devices 108 of the compute node tray 100 (as shown in FIG. 2A), in accordance to some examples of the present disclosure. In some examples, the plurality of devices 108 is disposed on the board 106. For example, each of the plurality of devices 108 may include an electronic device electrically connected to printed circuits (not shown) of the board 106 and supported by the board 106.

In some examples, the board 106 may be a rectangular or square shaped semiconductor component having a perimeter 170 defining the boundary of the board 106. The plurality of devices 108 is disposed within the perimeter 170 of the board 106. In some examples, the plurality of devices 108 may be categorized as a plurality of first devices 108A, a plurality of second devices 108B, and a plurality of third devices 108C. In such examples, the plurality of first devices 108A may include a plurality of dual in-line memory modules (DIMMs) 108A1 (it may be noted herein that only slots for holding the DIMMs are shown in FIG. 1C) and a plurality of voltage regulators (VRs) 108A2 of one or more of a plurality of DIMMs 108A1 or a plurality of processing resources 108B1. Similarly, the plurality of second devices 108B may include one or more of the plurality of processing resources 108B1 or a plurality of fabric mezzanine cards 108E32 (as shown in FIG. 2A). Further, the plurality of third devices 108C may include resistors, capacitors, inductors, integrated circuits, or batteries. In some examples, the plurality of processing resources 108B1 may be categorized as a first set of processing resources 109B1 and a second set of processing resources 109B2. In such examples, the first set of processing resources 109B1 includes an upstream processing resource 109B11 and a downstream processing resource 109B12. Similarly, the second set of resources 109E32 includes an upstream processing resource 109B21 and a downstream processing resource 109B22.

As discussed hereinabove, each of the plurality of first devices 108A may be a low-power device, where the power consumption by the low-power device may be less than 12 W, for example. Similarly, each of the plurality of second devices 108B is a high-power device, where the power consumption by the high-power device may be greater than 12 W, for example. It the illustrated example, the board 106 includes 32 slots for holding the plurality of DIMMS 108A1 and 4 slots for holding the plurality of processing resources 108B1, 12 pairs of slots for holding the plurality of fabric mezzanine cards 108B2.

FIG. 2A is a schematic diagram of a compute node tray 100 including the cooling assembly 102, the support structure assembly 104, the board 106, and the plurality of devices 108 of FIGS. 1A, 1B, 1C, in accordance to some examples of the present disclosure. It may be noted herein that the term "compute node tray" may also be referred to herein as a "first compute node tray".

Further, the plurality of devices 108 is disposed on the board 106 such that each of the plurality of devices 108 is electrically connected to printed circuits of the board 106 and supported by the board 106. Further, the cooling assembly 102 is also disposed on the board 106 to form a thermal contact with the plurality of devices 108. The support structure assembly 104 encompasses the board 106 along the perimeter 170 (as show in FIG. 1C) of the board 106, fastens to the board 106, and forms a thermal contact with a portion 106A of the board 106, the plurality of devices 108, for example, a plurality of third devices 108C, and the cooling assembly 102.

In some examples, the first conduit 120 of the cooling assembly 102 extends along the perimeter 170 (as shown in FIG. 1C) of the board 106 and forms the thermal contact with the plurality of first devices 108A. For example, the first conduit 120 forms the thermal contact with the plurality of DIMMs 108A1 via the plurality of DIMM cold blocks 160. Similarly, the first conduit 120 forms the thermal contact with the plurality of VRs 108A2 of one or more of the plurality of processing resources 108B1 (as shown in FIG. 1C) and the plurality of DIMMs 108A1 via the plurality of VR cold blocks 161.

The plurality of second conduits 128 of the cooling assembly 102, extends parallel to one another, and each second conduit 128 is coupled to the first and third conduits 120, 136 respectively. The first set of tubes 128A of the plurality of first conduits 128 forms the thermal contact with the board 106. Additionally, the upstream cold plates 130A1, 130B1 forms the thermal contact with the upstream processing resources 109B11, 109B21 respectively (as shown in FIG. 1C). Similarly, the downstream cold plates 130A2, 130E32 forms the thermal contact with the downstream processing resources 109B12, 109B22 respectively (as shown in FIG. 1C). The mid-board cold block 130C forms the thermal contact with the board 106, and the second set of tubes 128B forms the thermal contact the plurality of fabric mezzanine cards 108B2 and the mid-board cold block 130C. In other words, the second set of tubes 128B is inter disposed between the mid-board cold block 130C and the plurality of fabric mezzanine cards 108E32. The third conduit 136 extends parallel to a portion of the first conduit 120 along the axial direction 103. In the illustrated example, the first and the third conduits 120, 136 respectively of the cooling assembly 102, form the thermal contact with the support structure assembly 104. For example, the first conduit 120 forms the thermal contact with the frames 104A-

104D and the third conduit 136 forms the thermal contact with the frame 104B of the support structure assembly 104.

As discussed hereinabove, the compute node tray 100 includes the extension space 154 defined by the support structure assembly 104 at the second peripheral side 164 of the cooling assembly 102. In such examples, the compute node tray 102 further includes a side frame 172 disposed in the extension space 154 and coupled to the support structure assembly 104. In one or more examples, the side frame 172 may support a plurality of fourth devices 108D of the compute node tray 100. In some examples, the plurality of fourth devices 108D may include an open compute project (OCP) card and a non-volatile memory express, such as a solid state storage device. Further, the cooling assembly 102 may include a bypass section 184 positioned at the second peripheral side 164. In such examples, the bypass section 184 includes a fourth conduit 186 disposed in the extension space 154 and extending between the first and second o-ring ports 176, 180 respectively. The fourth conduit 186 is positioned parallel to the plurality of second conduits 128. In some examples, the fourth conduit 186 extends between the first and the third conduits 120, 136 and forms the thermal contact with each of the plurality of fourth devices 108D. In some examples, the first conduit 120 may additionally form the thermal contact with another first device 108, for example, a breeze board 174 disposed on the side frame 172. For example, the first conduit 120 forms the thermal contact with the breeze board 174 through a heat pipe 157 extending from the breeze board 174. In some examples, the heat pipe 157 may be a flexible heat pipe.

Figure 2B:
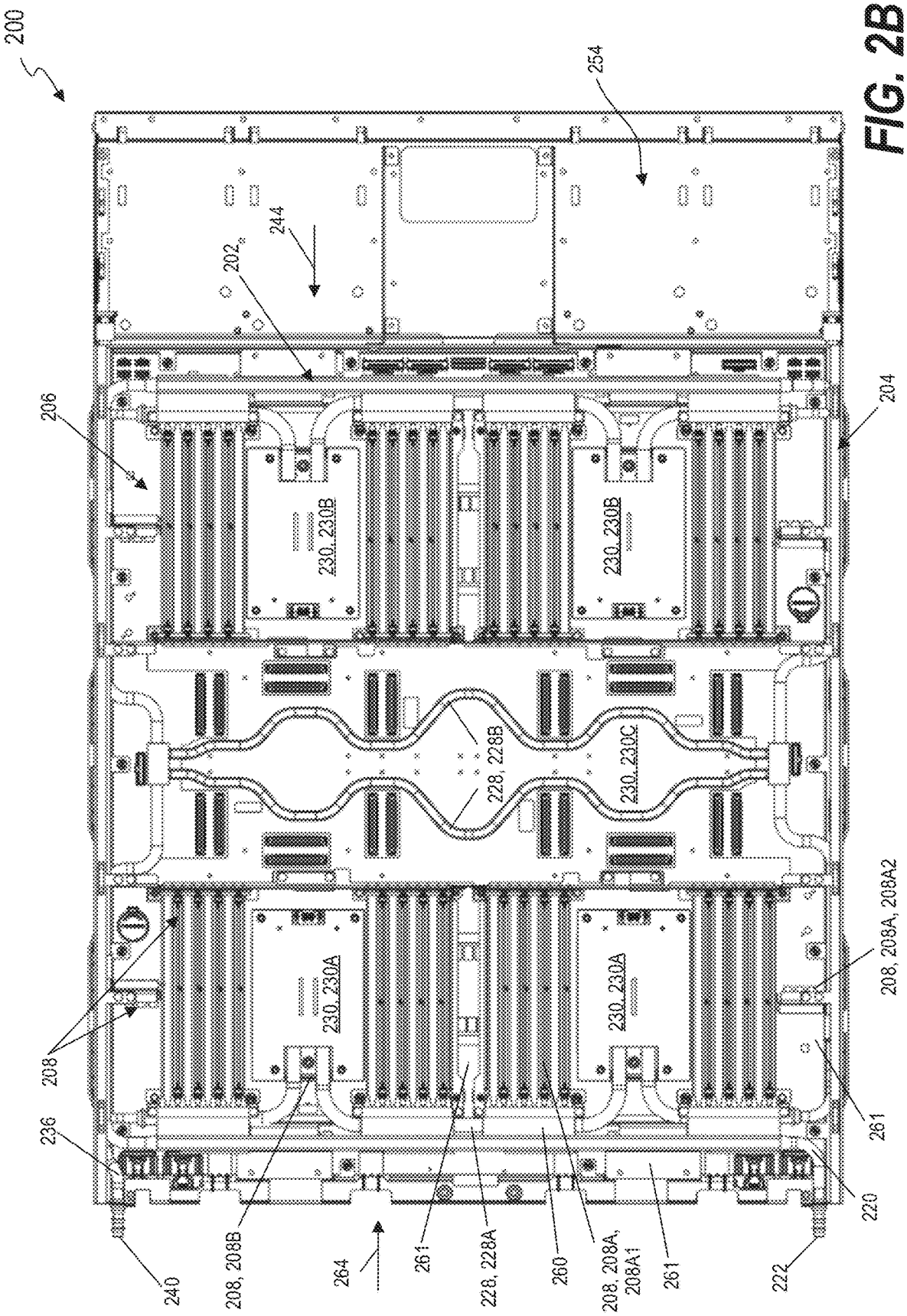
FIG. 2B illustrates a schematic diagram of a second compute node tray.

FIG. 2B is a schematic diagram of a second compute node tray 200, in accordance to some examples of the present disclosure. The second compute node tray 200 may include a cooling assembly 202, a support structure assembly 204, the board 206, and the plurality of devices 208. It may be noted herein that the cooling assembly 202 is substantially similar to the cooling assembly 102 described in the embodiments of FIGS. 1A, 1B, and 2A. Similarly, the support structure assembly 204 is substantially similar to the support structure assembly 104 described in the embodiments of FIGS. 1B and 2A. The board 206 is substantially similar to the board 106 described in the embodiments of FIGS. 1C and 2A, and the plurality of devices 208 is substantially similar to the plurality of devices 108 described in the embodiments of FIGS. 1C and 2A.

As discussed hereinabove, the first support structure assembly 108 of FIG. 2A may be referred to herein as a "first sub-structure assembly". Similarly, the "support structure assembly" of FIG. 2B may be referred to herein as a "second sub-structure assembly". In such examples, the first and second sub-structure assemblies 108, 208 may be collectively referred to as a "support structure assembly". Similarly, the second compute node assembly 200 may be referred to herein as a twinned or a replica of the first compute node assembly 100.

In the illustrated example, an extension space 254 of the second compute node tray 200 is defined at a first peripheral side 244 of the cooling assembly 202, unlike in the first compute node 100, where the extension space 154 is defined at the second peripheral side 164 of the cooling assembly 102. Similarly, an inlet port 222 of a first conduit 120, and an outlet port 240 of a third conduit 236 are positioned along a second peripheral side 264 of the cooling assembly 202, unlike in the first compute node tray 100, where the inlet port 122 and the outlet port 140 are positioned along the first peripheral side 144 of the cooling assembly 102.

The plurality of devices 208 is disposed on the board 206 such that each of the plurality of devices 208 is electrically connected to a printed circuit of the board 206 and supported by the board 206. Further, the cooling assembly 202 is disposed on the board 206 to form a thermal contact with the plurality of devices 208. For example, a first conduit 220 forms a thermal contact with a plurality of first devices 208A. It may be noted herein that FIG. 2B illustrates only a plurality of first devices 208A and does not illustrate a plurality of second devices 208, and such illustration should not be construed as a limitation of the present disclosure. For example, the first conduit 220 forms a thermal contact with the board 206, a plurality of dual in-line memory module (DIMM) cold blocks 260, and a plurality of voltage regulator (VR) cold blocks 261. As discussed hereinabove in the embodiment of FIG. 2A, the plurality of DIMM cold blocks 260 is in thermal contact with a plurality of DIMMs 208A1 and the plurality of VR cold blocks 261 is in thermal contact with the plurality of DIMMs 208A1 and a plurality of processing resources (not shown in FIG. 2B).

Similarly, a plurality of second conduits 228 and a plurality of cold plates 230 form the thermal contact with the plurality of second devices 208B. For example, a first set of tubes 228A of the plurality of second conduits 228 forms the thermal contact with the board 206. Similarly, a second set of tubes 228B of the plurality of second conduits 228 forms the thermal contact with a mid-board cold block 230C and a plurality of fabric mezzanine cards (not shown in FIG. 2B). Further, a first set of cold plates 230A of the plurality of cold plates 230 forms the thermal contact with a first set of processing resources of the plurality of processing resources (not shown in FIG. 1) and a second set of cold plates 230B of the plurality of cold plates 230 forms the thermal contact with a second set of processing resources of the plurality of processing resources (not shown in FIG. 2B).

Further, the support structure assembly 204 surrounds the board 206, fastens to the board 206, and forms a thermal contact with a portion 206A of the board 206, a plurality of third devices 208C, and the cooling assembly 202. For example, the support structure assembly 204 forms the thermal contact with a first conduit 220 and a third conduit 236 of the cooling assembly 202.

Figure 3:
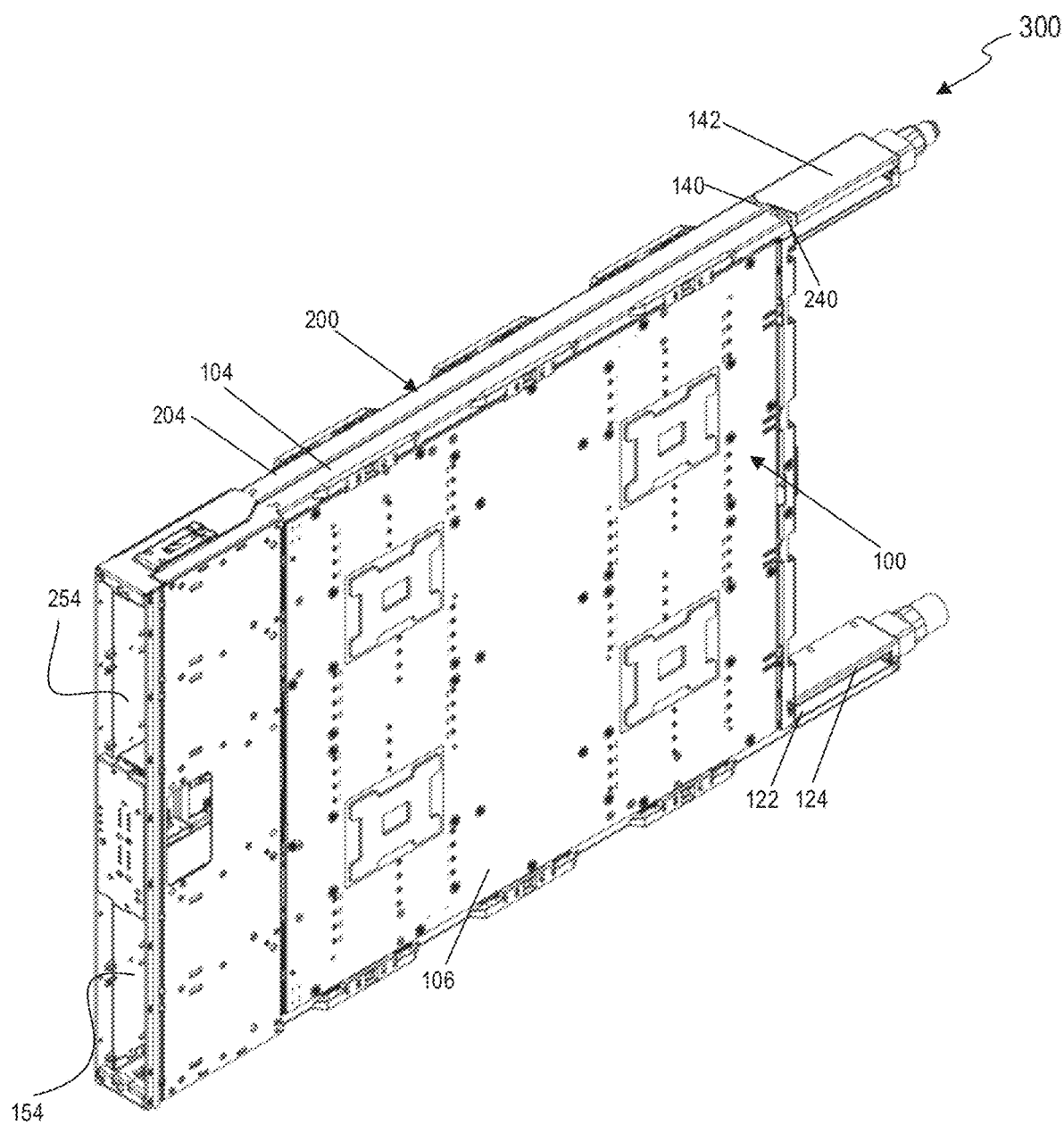
FIG. 3 illustrates a perspective view of an assembled compute node tray having the first and second compute node trays of FIGS. 2A and 2B.

FIG. 3 is a perspective view of an assembled compute node tray 300, for example, a twinned-compute node tray, in accordance to some examples of the present disclosure. It may be noted herein that the compute node tray 300 may also be referred to herein as a compound compute node tray 300. The compute node tray 300 includes a first compute node tray 100 of FIG. 2A and a second compute node tray 200 of FIG. 3A. In some examples, the twinned-compute node tray 300 includes a board, for example, a twinned-board 106, 206, a cooling assembly, for example a twinned-cooling assembly 102, 202, and a support structure assembly, for example, a set of sub-structures assemblies 104, 204. It may be noted herein that the compute node tray 300 may be formed beyond twinning i.e., the compute node tray 300 may include three or more parallel compute node trays, where all parallel compute node trays may be supported off to a common inlet and outlet of the CDU 402 (as shown in FIG. 4).

It may be noted herein that the compute node tray 300 is formed by disposing the first compute node tray 100 and the second compute node tray 200 on top of one another. In such examples, extension spaces 154, 254 of the twinned-cooling assembly 102, 202 may face one another and inlets 122, 222 of the first conduits, and the outlets 140, 240 of the third conduits are positioned along a same side of the compute node tray 300. Further, each cooling assembly of the twinned-cooling assembly 102, 202 is disposed on a corresponding board of the twinned-board 106, 206. Similarly, each sub-structure assembly 104, 204 encompasses a corresponding board of the twinned-board 106, 206.

FIG. 4 is a perspective view of a portion of a liquid-cooled rack 400 and a coolant distribution unit 402 (CDU), in accordance to some examples of the present disclosure. The liquid-cooled rack 400 includes a plurality of rows of racks 406 and a plurality of chassis 404 disposed one over another along the radial direction 101 in the plurality of row of racks 406. In some examples, each chassis 404 may have a plurality of slots 408 located adjacent to one another along the axial direction 103. In the illustrated example, the liquid-cooled rack 400 includes four chassis 404 and each chassis 404 includes eight slots 408.

The liquid-cooled rack 400 further includes a plurality of compute node trays 410. It may be noted herein that each of the plurality of compute node trays 410 may a twinned-compute node tray 300, as described in the embodiment of FIG. 3. In such examples, each of the plurality of compute node trays 410 may slide into any one of the eight slots 408 of respective chassis 404. Further, the CDU 402 may have an inlet manifold 411A coupled to a coolant inlet port 126 (as shown in FIG. 1A) to each cooling assembly of the plurality of compute node trays 410. Similarly, the CDU 402 may include an outlet manifold 411B coupled to a coolant outlet port 142 of each cooling assembly of the plurality of compute node trays 410. In such examples, the CDU 402 circulates a coolant to each cooling assembly of the plurality of compute node trays 410 so as to absorb heat from a plurality of devices 108 and a board 106, and thereby cool each compute node tray 400. For example, the coolant may flow from an inlet port 122, 222 of a respective first conduit 120, 220 (as shown in FIGS. 2A, 2B) to a respective outlet port 140, 240 of a third conduit 136, 236 (as shown in FIGS. 2A, 2B) via a plurality of respective second conduits 128, 228 (as shown in FIGS. 2A, 2B). The coolant after absorbing heat from the plurality of devices 108 and the board 106 is circulated to the CDU 402 via the outlet manifold 411B. In some examples, the heated coolant may be cooled within the CDU 402, using heat exchangers (not shown) and the cooled coolant is recirculated to each cooling assembly of the plurality of compute node trays 410.

Figure 5:
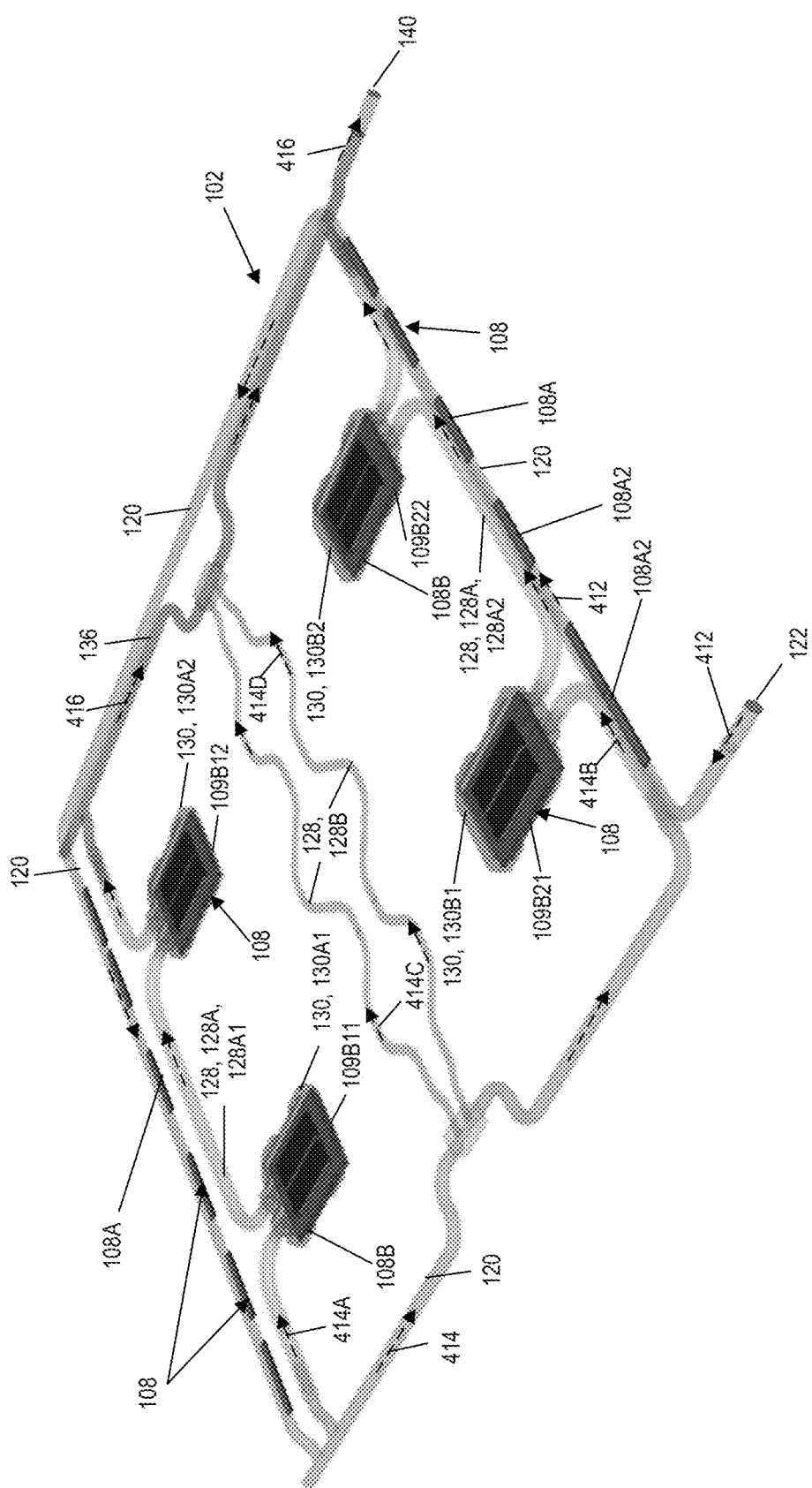
FIG. 5 illustrates a schematic diagram of a cooling assembly and a plurality of devices of FIG. 1C.

FIG. 5 is a schematic diagram of a cooling assembly 102 and a plurality of devices 108 of FIG. 2A of a compute node tray 100 (as shown in FIG. 2A), in accordance to some examples of the present disclosure. It should be noted herein that the embodiment of FIG. 5 does not show components, such as a support structure assembly 104 and a board 106 of the compute node tray 100, for ease of illustration and such illustration should not be construed as a limitation of the present disclosure.

During operation, the cooling assembly 102 receives a flow of coolant 412 from a coolant distribution unit (CDU) 402 (as shown in FIG. 4) via an inlet 122 of a first conduit 120. For example, the cooling assembly 102 may first direct the flow of the coolant 412 in the first conduit 120 to absorb heat from a plurality of first devices 108A of the board 106 and generate a partially heated coolant 414. As discussed hereinabove, the first conduit 120 extends along a perimeter 170 (as shown in FIG. 1C) of the board 106 and forms a thermal contact with the plurality of first devices 108A.

In one or more examples, the flow of coolant 412 in the first conduit 120 may absorb the heat from the plurality of first devices 108A including a plurality of dual in-line memory modules (DIMMs) 108A1 (as shown in FIG. 1C) and a plurality of voltage regulators (VRs) 108A2 of one or more of a plurality of processing resources 108B1 (as shown in FIG. 1C) or the plurality of DIMMs 108A1.

The cooling assembly 102 further directs a flow of the partially heated coolant 414 in a plurality of second conduits 128 and a plurality of cold plates 130 to absorb the heat from a plurality of second devices 108B of the board 106 and generate a heated coolant 416. As discussed hereinabove, the plurality of second conduits 128 and the plurality of cold plates 130 form the thermal contact with a plurality of second devices 108B.

For example, the partially heated coolant 414 gets split into four portions. A first portion 414A flows in a first tube 128A1 of a first set of tubes 128A, a second portion 414b flows in a second tube 128A2 of the first set of tubes 128A, and third and fourth portions 414C, 414D flow in a second set of tubes 128B. The first portion 414A of the partially heated coolant 414 flows from the first conduit 120 to the third conduit 136 via an upstream cold plate 130A1 and a downstream cold plate 130A2 and absorbs the heat from an upstream processing resource 109B11 and a downstream processing resource 109B12. Similarly, the second portion 414B of the partially heated coolant 414 flows from the first conduit 120 to the third conduit 136 via an upstream cold plate 130B1 and a downstream cold plate 130E32 and absorbs the heat from an upstream processing resource 109B21 and a downstream processing resource 109B22. Further, the third and fourth portions 414C, 414D of the partially heated coolant 414 flows from the first conduit 120 to the third conduit 136 and absorbs the heat from the mid-board cold block 130C and the plurality of fabric mezzanine cards 108B2 (as shown in FIG. 2A).

Additionally, the support structure assembly 104 (as shown in FIG. 2A) encompassing the board 106 absorbs the heat from the portion 106A of the board 106 and the plurality of third devices 108C (as shown in FIG. 1C) and transfers the absorbed heat to the cooling assembly 102 so as to further aid in cooling the compute node tray. For example, the frames 104A-104D of the support structure assembly 104 may absorb the heat from the portion 106A of the board 106 and the plurality of third devices 108C, and transfer the absorbed heat to the first and third conduits 120, 136 respectively. It may be noted herein that the heat generated from the portion 106A of the board 106 may be considered as a joule heat. In such examples, the support structure assembly 104 may absorb the joule heat, and thereby cool the portion 106A of the board 106. Similarly, the support structure 104 may further absorb heat from the plurality of third devices 108C, and thereby cool those third devices 108C. As discussed hereinabove, the support structure 104 may transfer the absorbed heat to the cooling assembly 102. Accordingly, the cooling assembly 102 may generate the partially heated coolant 414 or the heated coolant 416 using the transferred heat from the support structure 104. Later, the third conduit 136 may direct the heated coolant 416 out of the cooling assembly 102.

Therefore, in accordance to some examples of the present disclosure, the coolant 412 flows in a serial flow path to absorb the heat from the plurality of first devices 108A before the partially heated coolant 414 flows in a plurality of parallel flow paths to absorb the heat from the plurality of second devices 108b. Thus, the cooling assembly 102 is able to maintain the temperature of all the first devices 108A devices within certain range from each other. Further, the upstream cold plates 130A1, 130B1 having a first thermal resistance and the downstream cold plates 130A2, 130E32 having a second thermal resistance different from the first thermal resistance may help to maintain the temperature of all the second devices 108B devices within certain range from each other.

Further, the first set of tubes 128A is designed based on the principles of a tichelmann loop. In particular, the cooling assembly 102 is designed such that the first portion 414A of the partially heated coolant 414 flowing in the first tube 128A1 has a shortest supply path and a longest return path, whereas the second portion 414B of the partially heated coolant 414 flowing in the second tube 128A2 has a longest supply path and a shortest return path. Thus, the cooling assembly 102 that is designed based on principles of such tichelman loop, may enable balancing the flow of the coolant 412 between two parallel tubes 128A1, 128A2.

The cooling assembly 102 may later return the heated coolant 416 from the third conduit 136 to the CDU 402 via the outlet port 140. As discussed hereinabove, the third conduit 136 extends parallel to a portion of the first conduit 120. Thus, the cooling assembly 102 having the combination of the serial and parallel flow paths design as described hereinabove, may relatively decrease the required coolant flow rate in comparison with the required coolant flow rate in the fully parallelized flow design, for cooling the compute node tray 100. Further, since the cooling assembly 102 is able to relatively decrease the required coolant flow rate, the CDU 402 may be used for cooling a greater number of liquid-cooled racks 400. In other words, the cooling assembly 102 having the serial and parallel cooling as discussed hereinabove may enable a lower flow rate to have a higher CDU 402 to rack ratio, thus saving cost and decreasing power utilization efficiency (PUE, which is a measure of data center energy efficiency), and also relatively reducing pressure drop in the coolant 412 in comparison with the liquid cooling system that is designed based on the fully parallelized flow paths.

Figure 6:
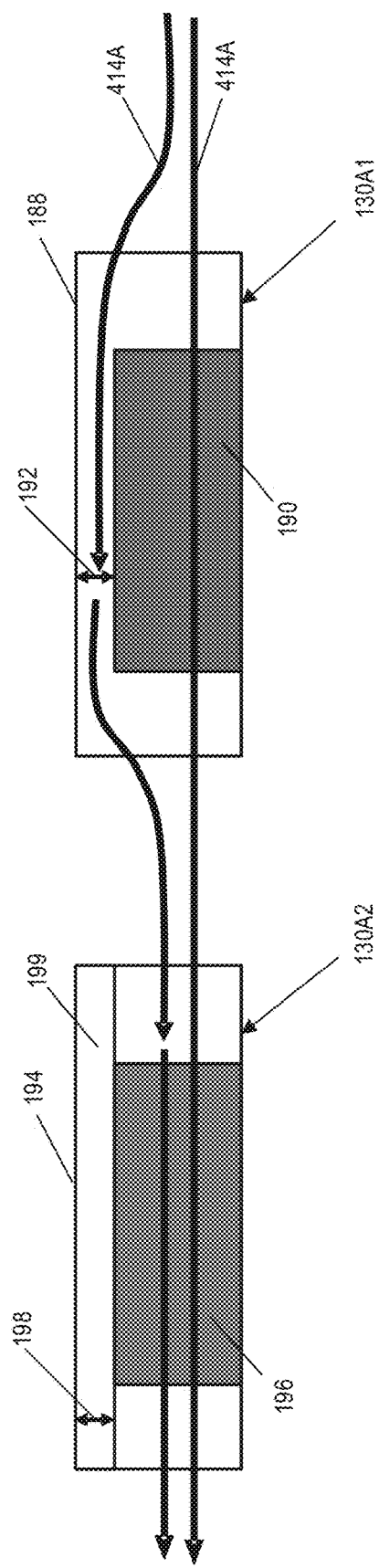
FIG. 6 illustrates a block diagram of an upstream cold plate and a downstream cold plate of a cooling assembly.
Figure 7:
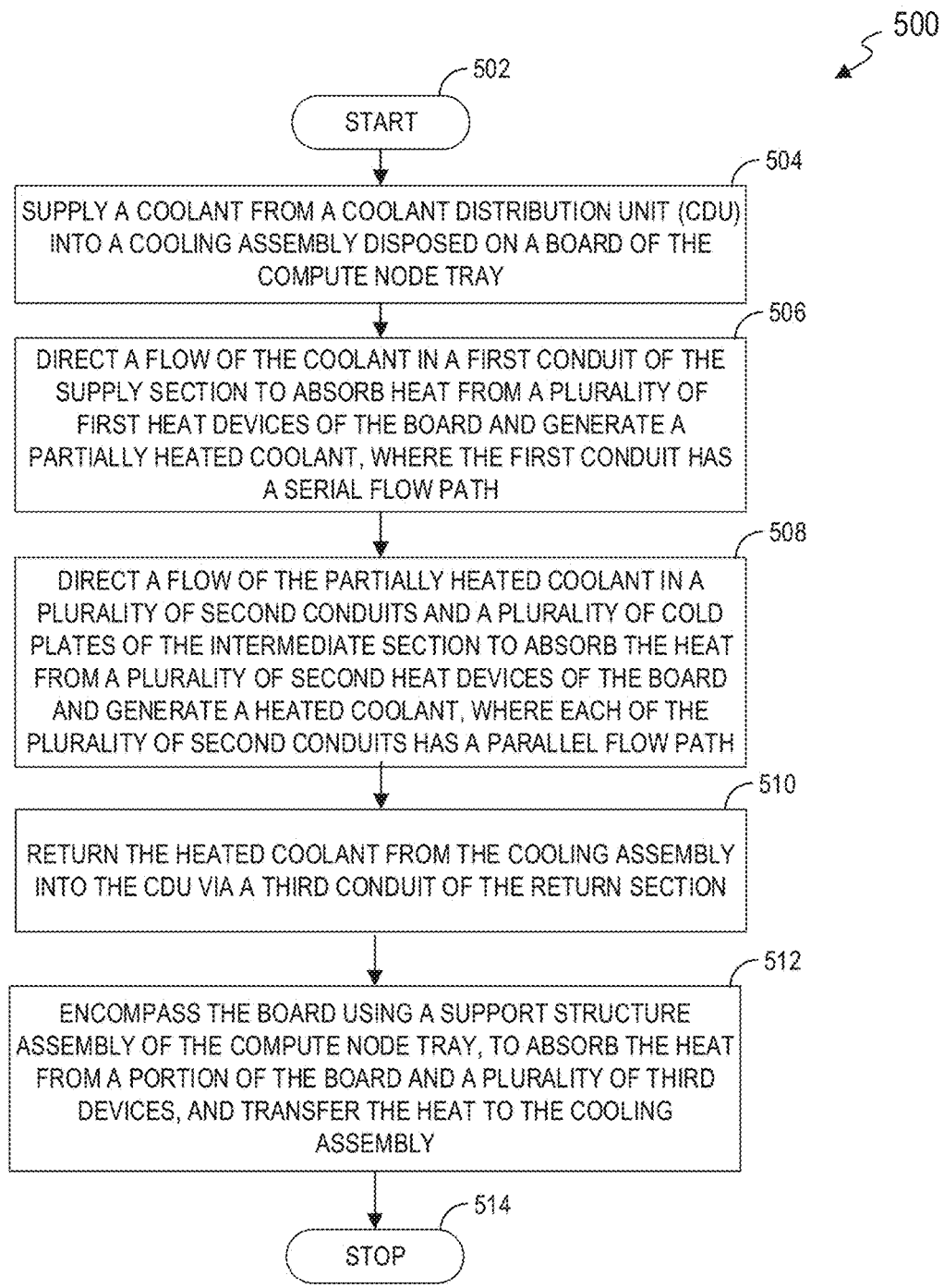
FIG. 7 is a flowchart depicting a method of cooling a compute node tray.

FIG. 6 is a block diagram of an upstream cold plate 130A1 and a downstream cold plate 130A2 connected in serial flow path of a first tube 128A1 of a cooling assembly 102, in accordance to some examples of the present disclosure. It may be noted herein that FIG. 6 represents sectional view of the upstream and downstream cold plates 130A1, 130A2. In some examples, the upstream cold plate 130A1 includes a first housing 188 and a plurality of fins 190 (only one fin is shown in FIG. 6) disposed within the first housing 188 such that a gap 192 is formed at a top portion of the first housing 188. The downstream cold plate 130A2 includes a second housing 194 and a plurality of fins 196 (only one fin is shown in FIG. 6) disposed within the second housing 194 such that a gap 198 is formed at a top portion of the second housing 194. The downstream cold plate 130A2 further includes a gasket 199 fitted to the gap 198.

During operation, the first portion 414A of the partially heated coolant 414 flows in the upstream cold plate 130A1 followed by the downstream cold plate 130A2. In such examples, the first portion 414A flows in between the fins of the plurality of fins 190 and in the gap 192. Since, the first portion 414A flows through the gap 192, the first portion 414A may partially absorb the heat from the upstream cold plate 130A1, which is in thermal contact with an upstream processing resource 109B11 (as shown in FIG. 6). However, the first portion 414A flows only between the fins of the plurality of fins 196 in the downstream cold plate 130A2. Thus, the first portion 414A may substantially absorb the heat from the downstream cold plate 130A2, which is in thermal contact with a downstream processing resource 109B12 (as shown in FIG. 6). Thus, the aforementioned design of the cooling assembly 102 may enable to have differential thermal resistances to the upstream cold plate 130A1 and the downstream cold plate 130A2, and may help the cooling assembly 102 to maintain the temperature between the second devices 1086 within certain range from each other.

FIG. 7 is a flowchart depicting a method 500 of cooling a compute node tray of a liquid-cooled rack, in accordance to some examples of the present disclosure. It should be noted herein that the method 500 is described in conjunction with the embodiments of FIGS. 2A and 5.

The method 500 starts at block 502 and continues to block 504. At block 504, the method 500 includes supplying a coolant from a coolant distribution unit (CDU) into a cooling assembly disposed on a board of the compute node tray, as described in the embodiments of FIGS. 2A and 5. The cooling assembly includes a supply section, a return section, and an intermediate section coupled to the supply and return sections.

The method 500 further continues at block 506. At block 506, the method 500 includes directing a flow of the coolant in a first conduit of the supply section to absorb heat from a plurality of first devices of the board and generate a partially heated coolant. The first conduit extends along a perimeter of the board and forms a thermal contact with the plurality of first devices. In some examples, the step of directing the flow of coolant in the first conduit includes directing the coolant in a serial flow path to absorb the heat from the plurality of first devices.

The method 500 further continues to block 508. At block 508, the method 500 includes directing a flow of the partially heated coolant in a plurality of second conduits and a plurality of cold plates of the intermediate section to absorb the heat from a plurality of second devices of the board and generate a heated coolant. The plurality of cold plates and the second conduits form the thermal contact with a plurality of second devices. The plurality of second conduits extends parallel to one another. In some examples, the step of directing the flow of the partially heated coolant in the plurality of second conduits includes directing the partially heated coolant in a plurality of parallel flow paths to absorb the heat from the plurality of second devices. Further, the step of directing the partially heated coolant further includes directing the flow of the partially heated coolant from an upstream cold plate to a downstream cold plate of a plurality of cold plates to maintain a substantially equal temperature between an upstream processing resource and a downstream processing resource of the plurality of second devices.

The method 500 further moves to block 510. At step 510, the method includes returning the heated coolant from the cooling assembly into the CDU via a third conduit of the return section. The third conduit extends parallel to a portion of the first conduit.

The method 500 further move to block 512. At block 512, the method includes encompassing the board using a support structure assembly of the compute node tray, to form a thermal contact with a portion of the board, a plurality of third devices, and the cooling assembly. In such examples, the support structure assembly may absorb the heat from the portion of the board and the plurality of third devices, and transfer the absorbed heat to the cooling assembly so as to cool the compute node tray.

In some examples, the method 500 may further include a step of balancing the flow of the coolant between two parallel conduits of the plurality of second conduits by directing the flow of the partially heated coolant from the first conduit to the third conduit based on principles of a tichelmann loop. Additionally, in some examples, the method 500 may further include a step of directing a portion of the partially heated coolant from the first conduit to the third conduit via a fourth conduit of a bypass section, for absorbing the heat from a plurality of fourth devices of the compute node tray and generate a portion of the heated coolant. The method 500 ends at block 514.

Various features as illustrated in the examples described herein may include a compute node tray having a cooling assembly and a support structure assembly that may collectively absorb heat from a board and a plurality of devices, and thereby cool the compute node tray. In some examples, the compute node tray is a twinned-compute node tray. In such examples, by using the combined mechanical and thermal structure, the number of fasteners and efforts required to assemble the compute node tray may be reduced. Further, the compute node tray having the series and parallel flow design may relatively decrease the required flow rate in comparison with the prior design. Thus, the lower required flow rate may result in using a cooling distribution unit (CDU) to cool more liquid-cooled racks.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A compute node tray comprising:
   a board;
   a plurality of first devices and a plurality of second devices disposed on the board;
   a cooling assembly disposed on the board, comprising a supply section, a return section, and an intermediate section coupled to the supply and return sections,
   wherein the supply section comprises a first conduit extending along a perimeter of the board and forming a thermal contact with the plurality of first devices, wherein the intermediate section comprises a plurality of cold plates and a plurality of second conduits forming a thermal contact with the plurality of second devices, wherein the plurality of second conduits extend parallel to one another, and wherein the return section comprises a third conduit extending parallel to a portion of the first conduit; and
   a support structure assembly that encompasses the board and forms a thermal contact with a portion of the board, a plurality of third devices, and the cooling assembly.

2. The compute node tray of claim 1, wherein the first conduit further comprises a first o-ring port and a first valve detachably coupled to the first o-ring port, wherein the third conduit further comprises a second o-ring port and a second valve detachably coupled to the second o-ring port, wherein the cooling assembly further comprises a bypass section comprising a fourth conduit extending between the first and second o-ring ports and forming a thermal contact with a plurality of fourth devices of the compute node tray, and wherein the fourth conduit is positioned parallel to the plurality of second conduits.

3. The compute node tray of claim 2, wherein the plurality of second conduits comprises a first set of tubes and a second set of tubes, wherein the plurality of cold plates comprises a first set of cold plates and a second set of cold plates.

4. The compute node tray of claim 3, wherein each set of cold plates of the first and second set of cold plates comprises an upstream cold plate and a downstream cold plate, wherein each tube of the first set of tubes extends between the first conduit and the third conduit via the upstream and downstream cold plates.

5. The compute node tray of claim 4, wherein the upstream cold plate has a first thermal resistance and the downstream cold plate has a second thermal resistance different from the first thermal resistance.

6. The compute node tray of claim 3, wherein each tube of the second set of tubes has a serpentine flow path.

7. The compute node tray of claim 3, wherein each tube of the first set of tubes is a flexible tube.

8. The compute node tray of claim 3, wherein the first conduit has a shortest supply path to a first tube of the first set of tubes and the third conduit has a longest return path from the first tube, and wherein the first conduit has a longest supply path to a second tube of the first set of tubes and the third conduit has a shortest return path from the second tube.

9. The compute node tray of claim 3, wherein the plurality of first devices comprises one or more of a plurality of dual in-line memory modules (DIMMs) or a plurality of voltage regulators of at least one of a plurality of processing resources or the plurality of DIMMs, wherein the plurality of second devices comprises one or more of the plurality of processing resources or a plurality of fabric mezzanine cards, wherein the plurality of third devices comprises one or more of resistors, capacitors, inductors, integrated circuits, or batteries, and wherein the plurality of fourth devices comprises one or more of a non-volatile memory express or an open compute project (OCP) card.

10. The compute node tray of claim 1, wherein the board is a twinned-board, wherein the cooling assembly is a twinned-cooling assembly, wherein each cooling assembly of the twinned-cooling assembly is disposed on a corresponding board of the twinned-board, and wherein the support structure assembly comprises a set of sub-structure assemblies, each sub-structure assembly encompassing a corresponding board of the twinned-board.

11. The compute node tray of claim 1, wherein a coolant is directed from an inlet port of the first conduit to an outlet port of the third conduit via the plurality of second conduits and the plurality of cold plates, wherein the coolant absorbs heat from the plurality of first and second devices.

12. The compute node tray of claim 11, wherein the coolant flows in a serial flow path to absorb the heat from the plurality of first devices, before the coolant flows in a parallel flow path to absorb the heat from the plurality of second devices.

13. The compute node tray of claim 11, wherein the support structure assembly absorbs the heat from the board and the cooling assembly.

14. A method of cooling a compute node tray, comprising:
   supplying a coolant to a cooling assembly disposed on a board of the compute node tray, wherein the cooling assembly comprises a supply section, a return section, and an intermediate section coupled to the supply and return sections;
   directing a flow of the coolant in a first conduit of the supply section to absorb heat from a plurality of first devices of the board and generate a partially heated coolant, wherein the first conduit extends along a perimeter of the board and forms a thermal contact with the plurality of first devices;
   directing a flow of the partially heated coolant in a plurality of second conduits and a plurality of cold plates of the intermediate section to absorb the heat from a plurality of second devices of the board and generate a heated coolant, wherein the plurality of cold plates and the second conduits form a thermal contact with the plurality of second devices, wherein the plurality of second conduits extend parallel to one another;

returning the heated coolant from the cooling assembly via a third conduit of the return section, wherein the third conduit extends parallel to a portion of the first conduit; and encompassing the board using a support structure assembly of the compute node tray, to absorb the heat from a portion of the board and a plurality of third devices, and transfer the heat to the cooling assembly, wherein the support structure assembly forms a thermal contact with the portion of the board, the plurality of third devices, and the cooling assembly.

15. The method of claim 14, wherein directing the flow of coolant in the first conduit comprises directing the coolant in a serial flow path to absorb the heat from the plurality of first devices, wherein directing the flow of the partially heated coolant in the plurality of second conduits comprises directing the partially heated coolant in a plurality of parallel flow paths to absorb the heat from the plurality of second devices.

16. The method of claim 14, further comprising balancing the flow of the coolant between a first set of parallel tubes of the plurality of second conduits by directing the flow of the partially heated coolant from the first conduit to the third conduit based on principles of a Tichelmann loop, wherein the first conduit has a shortest supply path to a first tube of the first set of tubes and the third conduit has a longest return path from the first tube, and wherein the first conduit has a longest supply path to a second tube of the first set of tubes and the third conduit has a shortest return path from the second tube.

17. The method of claim 14, wherein directing the partially heated coolant further comprises directing the flow of the partially heated coolant from an upstream cold plate to a downstream cold plate of a plurality of cold plates to maintain a substantially equal temperature between an upstream device and a downstream device of the plurality of second devices, wherein the upstream cold plate has a first thermal resistance and the downstream cold plate has a second thermal resistance different from the first thermal resistance.

18. The method of claim 14, further comprising directing a portion of the partially heated coolant from the first conduit to the third conduit via a fourth conduit of a bypass section, for absorbing the heat from a plurality of fourth devices of the compute node tray and generating a portion of the heated coolant, wherein the first conduit comprises a first o-ring port and a first valve detachably coupled to the first o-ring port, wherein the third conduit comprises a second o-ring port and a second valve detachably coupled to the second o-ring port, wherein the fourth conduit extends between the first and second o-ring ports and is positioned parallel to the plurality of second conduits forming the thermal contact with the plurality of fourth devices.

19. The method of claim 18, wherein the plurality of first devices comprises one or more of a plurality of dual in-line memory modules (DIMMs) or a plurality of voltage regulators of at least one of a plurality of processing resources or the plurality of DIMMs, wherein the plurality of second devices comprises one or more of the plurality of processing resources or a plurality of fabric mezzanine cards, wherein the plurality of third devices comprises one or more of resistors, capacitors, inductors, integrated circuits, or batteries, and wherein the plurality of fourth devices comprises one or more of a non-volatile memory express or an open compute project (OCP) card.

20. The method of claim 14, wherein the board is a twinned-board, wherein the cooling assembly is a twinned-cooling assembly, wherein each cooling assembly of the twinned-cooling assembly is disposed on a corresponding board of the twinned-board, and wherein the support structure assembly comprises a set of sub-structure assemblies, each sub-structure assembly encompassing a corresponding board of the twinned-board.

\* \* \* \* \*